United States Patent
Lehtola

(10) Patent No.: US 11,894,808 B2
(45) Date of Patent: *Feb. 6, 2024

(54) POWER AMPLIFIER WITH VARIABLE BIAS IMPEDANCE

(71) Applicant: Skyworks Solutions, Inc., Irvine, CA (US)

(72) Inventor: Philip John Lehtola, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/487,933

(22) Filed: Sep. 28, 2021

(65) Prior Publication Data

US 2022/0021340 A1 Jan. 20, 2022

Related U.S. Application Data

(63) Continuation of application No. 16/527,594, filed on Jul. 31, 2019, now Pat. No. 11,165,392.

(Continued)

(51) Int. Cl.
| | | |
|---|---|---|
| *H03F 1/02* | (2006.01) | |
| *H03F 3/21* | (2006.01) | |
| *H03F 1/08* | (2006.01) | |
| *H03F 3/19* | (2006.01) | |
| *H03G 3/30* | (2006.01) | |

(52) U.S. Cl.
CPC ............. *H03F 1/0205* (2013.01); *H03F 1/08* (2013.01); *H03F 3/19* (2013.01); *H03F 3/21* (2013.01); *H03G 3/30* (2013.01)

(58) Field of Classification Search
CPC . H03F 1/0205; H03F 1/08; H03F 3/19; H03F 3/21; H03F 2200/451; H03F 3/245; H03F 3/24; H03F 3/189; H03F 1/0261; H03F 1/302; H03F 3/191; H03F 3/3432;
(Continued)

(56) References Cited

U.S. PATENT DOCUMENTS

| 5,646,573 A | 7/1997 | Bayruns et al. |
| 6,339,361 B1 | 1/2002 | Khesbak et al. |

(Continued)

FOREIGN PATENT DOCUMENTS

| CN | 106026932 | 10/2016 |
| JP | H09-51238 | 2/1997 |

(Continued)

*Primary Examiner* — Hieu P Nguyen
(74) *Attorney, Agent, or Firm* — Knobbe, Martens, Olson & Bear, LLP

(57) ABSTRACT

Systems and methods including variable power amplifier bias impedance are disclosed. In one aspect, there is provided a power amplifier system including a bias circuit configured to receive a bias voltage and generate a bias signal and a power amplifier stage configured to receive an input radio frequency (RF) signal and generate an output RF signal. The power amplifier system may also include a bias impedance component operatively coupled between the bias circuit and the power amplifier stage. The bias impedance is component configured to receive a control signal and adjust an impedance value of the bias impedance component in response to the control signal.

20 Claims, 11 Drawing Sheets

Related U.S. Application Data

(60) Provisional application No. 62/713,150, filed on Aug. 1, 2018.

(58) Field of Classification Search
CPC .......... H03G 3/30; H03G 3/3042; H04B 1/04; H04B 2001/0408
USPC .......................................... 330/285, 296, 277
See application file for complete search history.

(56) References Cited

U.S. PATENT DOCUMENTS

| | | |
|---|---|---|
| 6,404,284 B1 | 6/2002 | Johnson et al. |
| 6,424,225 B1 | 7/2002 | Choi et al. |
| 6,496,073 B2 | 12/2002 | Choi |
| 6,559,722 B1 | 5/2003 | Lopez et al. |
| 6,617,928 B2 | 9/2003 | Finlay et al. |
| 6,639,465 B2 | 10/2003 | Samelis et al. |
| 6,753,734 B2 | 6/2004 | Arell et al. |
| 6,771,130 B2 | 8/2004 | Hasegawa et al. |
| 6,784,748 B1 | 8/2004 | Canyon et al. |
| 6,873,211 B1 | 3/2005 | Thompson et al. |
| 6,937,102 B2 | 8/2005 | Lopez et al. |
| 6,946,911 B2 | 9/2005 | Yang et al. |
| 6,961,554 B1 | 11/2005 | Constantin |
| 7,218,170 B1 | 5/2007 | Carter et al. |
| 7,248,111 B1 | 7/2007 | Xu et al. |
| 7,262,657 B2 | 8/2007 | Nellis et al. |
| 7,276,973 B2 | 10/2007 | Ripley et al. |
| 7,414,479 B2 | 8/2008 | Ripley et al. |
| 7,446,612 B2 | 11/2008 | Fisher et al. |
| 7,876,157 B1 | 1/2011 | Kang et al. |
| 8,497,736 B1 | 7/2013 | Leipold et al. |
| 9,337,787 B2 | 5/2016 | Schooley et al. |
| 9,413,313 B2 | 8/2016 | Banowetz et al. |
| 9,419,567 B2 | 8/2016 | Ripley et al. |
| 9,602,064 B2 * | 3/2017 | Wu .................. H03F 3/68 |
| 9,608,576 B2 | 3/2017 | Lam |
| 9,621,119 B2 | 4/2017 | Lehtola |
| 9,634,619 B2 | 4/2017 | Gerard et al. |
| 9,667,210 B2 | 5/2017 | Couglar et al. |
| 9,698,734 B2 | 7/2017 | Lehtola et al. |
| 9,755,595 B1 * | 9/2017 | Lin .................. H03F 1/303 |
| 9,800,216 B2 | 10/2017 | Pukhovski |
| 9,893,686 B2 | 2/2018 | Ripley |
| 9,893,687 B2 | 2/2018 | Lehtola |
| 9,917,549 B1 | 3/2018 | Allen |
| 9,935,593 B2 | 4/2018 | Lyalin |
| 9,935,594 B2 | 4/2018 | Lehtola |
| 10,008,983 B2 | 6/2018 | Quaglietta |
| 10,033,336 B2 | 7/2018 | Banowetz et al. |
| 10,116,274 B2 | 10/2018 | Ripley et al. |
| 10,181,820 B2 | 1/2019 | Balteanu et al. |
| 10,224,876 B2 | 3/2019 | Gorbachov et al. |
| 10,236,847 B2 | 3/2019 | Couglar et al. |
| 10,250,202 B2 | 4/2019 | Lehtola et al. |
| 10,284,160 B2 | 5/2019 | Lee |
| 10,381,990 B2 | 8/2019 | Allen |
| 11,165,392 B2 | 11/2021 | Lehtola |
| 2008/0238553 A1 | 10/2008 | Cho et al. |
| 2011/0070848 A1 | 3/2011 | Ramachandra Reddy |
| 2011/0298280 A1 | 12/2011 | Homol et al. |
| 2011/0298432 A1 | 12/2011 | Couglar et al. |
| 2014/0375390 A1 | 12/2014 | Schooley et al. |
| 2015/0381123 A1 | 12/2015 | Wu et al. |
| 2017/0133988 A1 | 5/2017 | Rogers |
| 2017/0294880 A1 | 10/2017 | Gerard et al. |
| 2018/0062598 A1 | 3/2018 | Lee |
| 2018/0226925 A1 | 8/2018 | Lyalin |
| 2018/0316311 A1 | 11/2018 | Gebeyehu et al. |
| 2018/0316316 A1 | 11/2018 | Banowetz et al. |
| 2019/0123690 A1 | 4/2019 | Balteanu et al. |
| 2019/0229682 A1 | 7/2019 | Gorbachov et al. |
| 2020/0044609 A1 | 2/2020 | Lehtola |

FOREIGN PATENT DOCUMENTS

| | | |
|---|---|---|
| JP | H10-290129 | 10/1998 |
| JP | H10-322144 | 12/1998 |
| JP | 2001-068950 | 3/2001 |
| JP | 2001-217654 | 8/2001 |
| JP | 2010-278521 | 12/2010 |
| JP | 2012-227637 | 11/2012 |
| JP | 2016-192590 | 11/2016 |
| JP | 2017-225104 | 12/2017 |
| TW | 564592 | 12/2003 |
| TW | I261413 | 9/2006 |
| TW | 2015-34050 | 9/2015 |
| TW | 2018-24738 | 7/2018 |

* cited by examiner

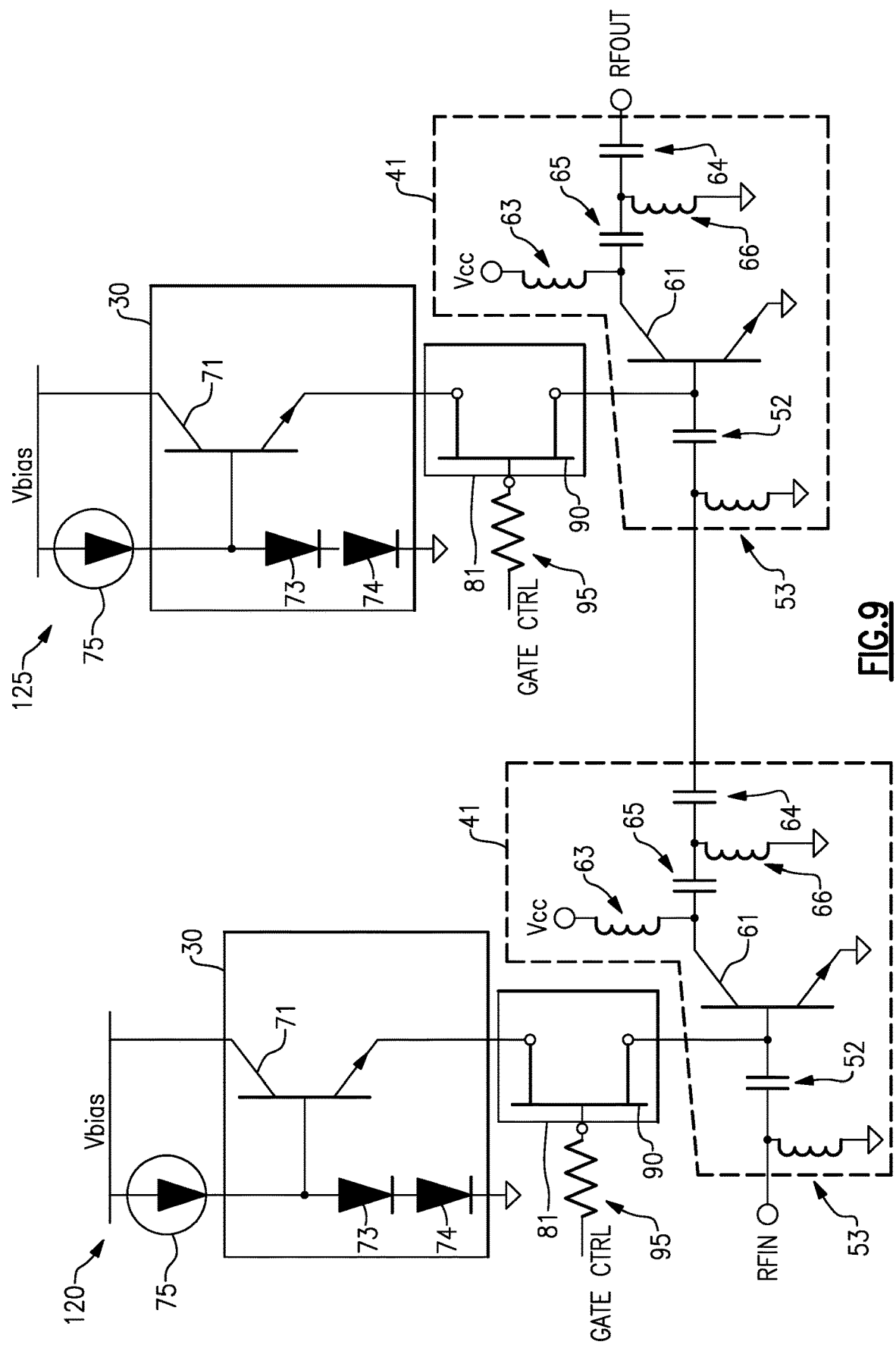

POWER AMPLIFIER WITH VARIABLE BIAS IMPEDANCE

RELATED APPLICATIONS

Any and all applications for which a foreign or domestic priority claim is identified in the Application Data Sheet, or any correction thereto, are hereby incorporated by reference into this application under 37 CFR 1.57.

BACKGROUND

Field

Embodiments of the described technology relate to electronic systems, and in particular, to systems including power amplifiers for radio frequency (RF) electronics.

Description of the Related Technology

RF power amplifiers can be used to boost the power of an RF signal having a relatively low power. Thereafter, the boosted RF signal can be used for a variety of purposes, included driving the antenna of a transmitter.

Power amplifiers can be included in mobile phones to amplify an RF signal for transmission. For example, in mobile phones that communicate using a cellular standard, a wireless local area network (WLAN) standard, and/or any other suitable communication standard, a power amplifier can be used to amplify the RF signal. It can be important to manage the amplification of an RF signal, as amplifying the RF signal to an incorrect power level or introducing significant distortion of the original RF signal can cause a wireless device to transmit out of band or violate compliance with accepted standards. Biasing of a power amplifier device is an important part of managing the amplification because it can determine the voltage and/or current operating point of the amplifying devices within the power amplifier.

There is a need for improved power amplifier systems. Furthermore, there is a need for improving power amplifier biasing.

SUMMARY

Aspects of this disclosure relate to techniques and electronic systems which can be used to improve power amplifier biasing. For example, in one aspect, a power amplifier system, includes a bias circuit configured to receive a bias voltage and generate a bias signal; a power amplifier stage configured to receive an input radio frequency signal and generate an output radio frequency signal. The system further includes a bias impedance component operatively coupled between the bias circuit and the power amplifier stage, the bias impedance component configured to receive a control signal and adjust an impedance value of the bias impedance component in response to the control signal.

A method of adjusting a gain of a power amplifier stage is provided according to another aspect of the disclosure. The method includes receiving, at a bias circuit, a bias voltage, generating, by the bias circuit, a bias signal based on the bias voltage, and receiving, at a bias impedance component, the bias voltage and a control signal. The method further includes adjusting, at the bias impedance component, an impedance value of the bias impedance component based on the received control signal, receiving, at a power amplifier stage, an input radio frequency signal and the bias voltage from the bias impedance component, and generating an output radio frequency signal based on the input radio frequency signal and the bias voltage.

A mobile device is provided according to yet another aspect of the disclosure. The mobile device includes a power amplifier configured to amplify an input radio frequency signal and generate an output radio frequency signal and a modulator configured to generate a radio frequency transmit signal based on the output radio frequency signal. The power amplifier includes a bias circuit configured to receive a bias voltage and generate a bias signal, a power amplifier stage configured to receive the input radio frequency signal and generate the output radio frequency signal, and a bias impedance component operatively coupled between the bias circuit and the power amplifier stage. The bias impedance component is configured to receive a control signal and adjust an impedance value of the bias impedance component in response to the control signal.

BRIEF DESCRIPTION OF THE DRAWINGS

FIG. 9 illustrates an embodiment of a multi-stage power amplifier system in accordance with aspects of this disclosure.

DETAILED DESCRIPTION

The headings provided herein, if any, are for convenience only and do not necessarily affect the scope or meaning of the claimed invention.

Apparatus and methods for biasing power amplifiers are disclosed herein. In certain implementations, a power amplifier system including a power amplifier and a bias circuit is provided. The power amplifier can be used to amplify a radio frequency (RF) signal for transmission, and the bias circuit can be used to generate a bias voltage for biasing the power amplifier. The power amplifier bias circuit can receive an enable signal that can be used to enable or disable the power amplifier so as to pulse the power amplifier's output.

As is described in greater detail below, the bias impedance of the signal provided to the power amplifier by the bias circuit may affect certain characteristics of the power amplifier, and in particular, the power amplifier gain characteristics. Thus, the design and selection of the bias impedance provided by the bias circuit is an important design characteristic to be considered during power amplifier system design. Aspects of this disclosure relate to a power amplifier system which may have an adjustable bias impedance, which can be used to select power amplifier gain characteristics depending on the design and/or application requirements of the power amplifier system.

Overview of Examples of Power Amplifier Systems

Figure 1:
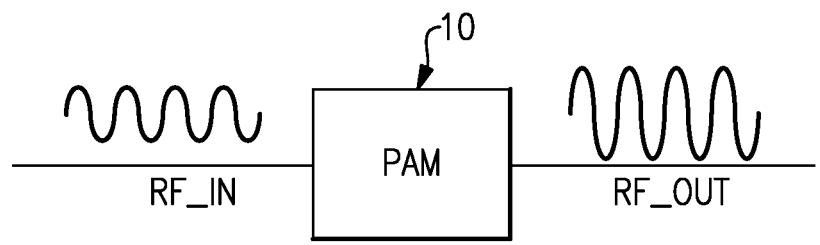
FIG. 1 is a schematic diagram of a power amplifier module for amplifying a radio frequency (RF) signal.

FIG. 1 is a schematic diagram of a power amplifier module 10 for amplifying a radio frequency (RF) signal. The illustrated power amplifier module (PAM) 10 can be configured to amplify an RF signal RF_IN to generate an amplified RF signal RF_OUT. As described herein, the power amplifier module 10 can include one or more power amplifiers, including, for example, multi-stage power amplifiers.

Figure 2:
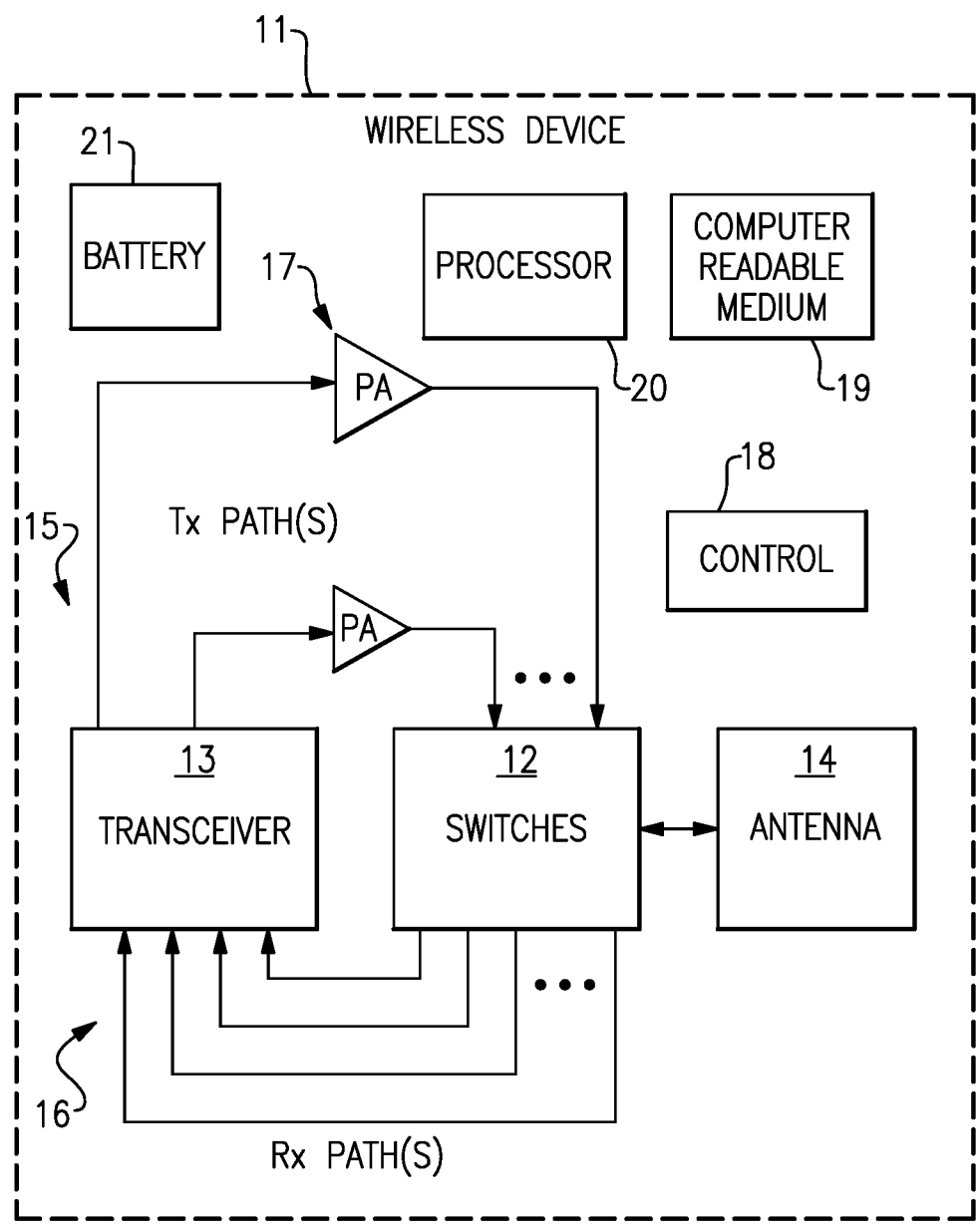
FIG. 2 is a schematic block diagram of an example wireless device that can include one or more of the power amplifier modules of FIG. 1.

FIG. 2 is a schematic block diagram of an example wireless or mobile device 11 that can include one or more of the power amplifier modules of FIG. 1. The wireless device 11 can include power amplifier bias circuits implementing one or more features of the present disclosure.

The example wireless device 11 depicted in FIG. 2 can represent a multi-band and/or multi-mode device such as a multi-band/multi-mode mobile phone. In the illustrated configuration, the wireless device 11 includes switches 12, a transceiver 13, an antenna 14, power amplifiers 17, a control component 18, a computer readable medium 19, a processor 20, and a battery 21.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17 shown can represent amplifications associated with different power output configurations (e.g., low power output and high power output), and/or amplifications associated with different bands. Although FIG. 2 illustrates a configuration using two transmission paths 15, the wireless device 11 can be adapted to include more or fewer transmission paths 15.

The power amplifiers 17 can be used to amplify a wide variety of RF signals. For example, one or more of the power amplifiers 17 can receive an enable signal that can be used to pulse the output of the power amplifier to aid in transmitting a wireless local area network (WLAN) signal or any other suitable pulsed signal. In certain configurations, one or more of the power amplifiers 17 are configured to amplify a Wi-Fi signal. Each of the power amplifiers 17 need not amplify the same type of signal. For example, one power amplifier can amplify a WLAN signal, while another power amplifier can amplify, for example, a Global System for Mobile (GSM) signal, a code division multiple access (CDMA) signal, a W-CDMA signal, a Long Term Evolution (LTE) signal, or an EDGE signal.

One or more features of the present disclosure can be implemented in the foregoing example modes and/or bands, and in other communication standards.

In FIG. 2, one or more detected signals from the antenna 14 are depicted as being provided to the transceiver 13 via one or more receiving paths 16. In the example shown, different receiving paths 16 can represent paths associated with different bands. Although FIG. 2 illustrates a configuration using four receiving paths 16, the wireless device 11 can be adapted to include more or fewer receiving paths 16.

To facilitate switching between receive and transmit paths, the switches 12 can be configured to electrically connect the antenna 14 to a selected transmit or receive path. Thus, the switches 12 can provide a number of switching functionalities associated with an operation of the wireless device 11. In certain configurations, the switches 12 can include a number of switches that provide functionalities associated with, for example, switching between different bands, switching between different power modes, switching between transmission and receiving modes, or some combination thereof. The switches 12 can also provide additional functionality, including filtering and/or duplexing of signals.

FIG. 2 shows that in certain configurations, a control component 18 can be provided for controlling various control functionalities associated with operations of the switches 12, the power amplifiers 17, and/or other operating component(s), such as bias circuits. Non-limiting examples of the control component 18 are described herein in greater detail.

In certain configurations, a processor 20 can be configured to facilitate implementation of various processes described herein. The processor 20 can operate using computer program instructions. These computer program instructions may be provided to the processor 20.

In certain configurations, these computer program instructions may also be stored in a computer-readable memory 19 that can direct the processor 20 or other programmable data processing apparatus to operate in a particular manner.

The battery 21 can be any suitable battery for use in the wireless device 11, including, for example, a lithium-ion battery.

Figure 3:
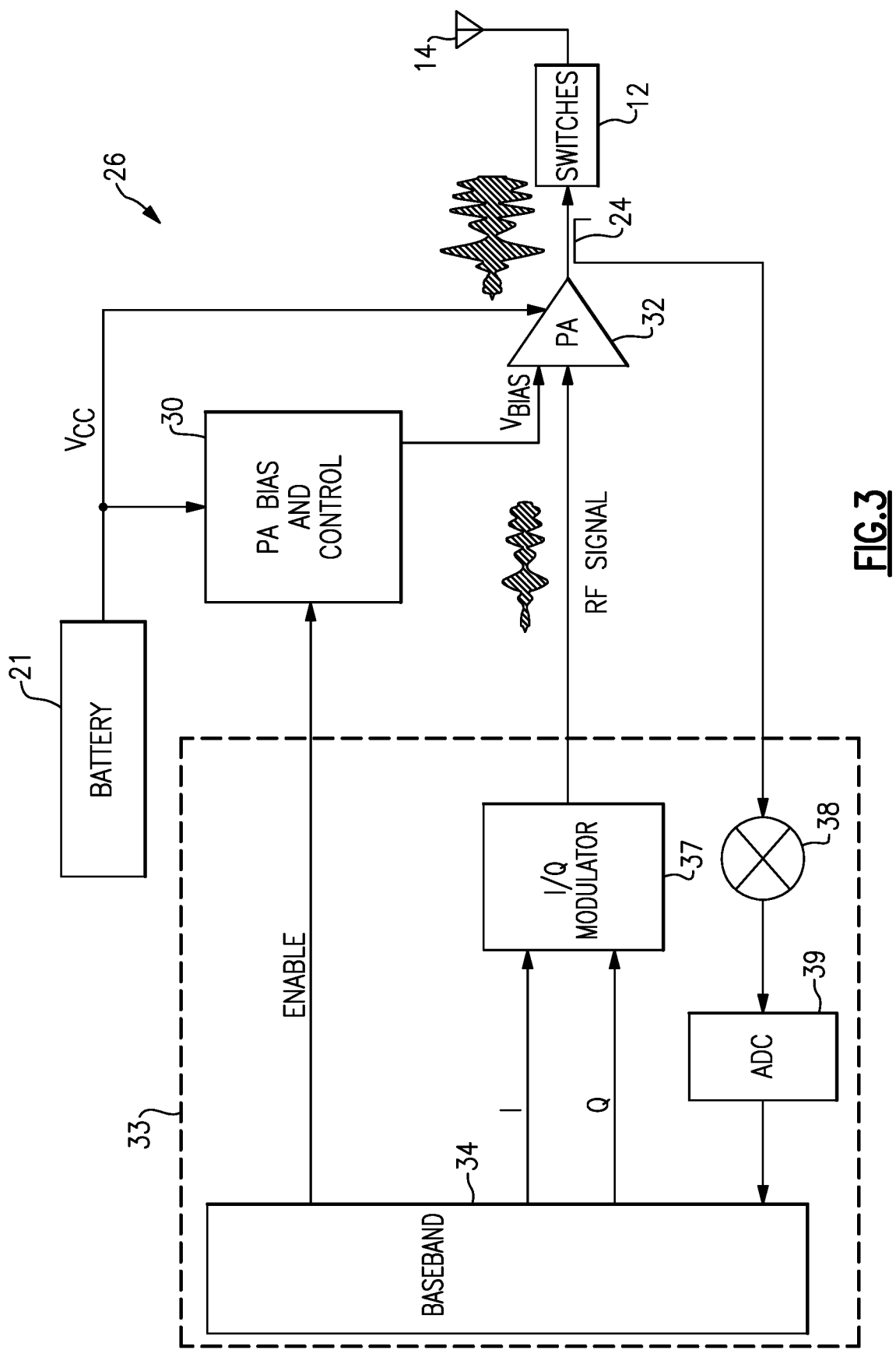
FIG. 3 is a schematic block diagram of one example of a power amplifier system.

FIG. 3 is a schematic block diagram of one example of a power amplifier system 26. The illustrated power amplifier system 26 includes the switches 12, the antenna 14, the battery 21, a directional coupler 24, a power amplifier bias circuit 30, a power amplifier 32, and a transceiver 33. The illustrated transceiver 33 includes a baseband processor 34, an I/Q modulator 37, a mixer 38, and an analog-to-digital converter (ADC) 39. Although not illustrated in FIG. 3 for clarity, the transceiver 33 can include circuitry associated with receiving signals over one or more receive paths.

The baseband signal processor 34 can be used to generate an I signal and a Q signal, which can be used to represent a sinusoidal wave or signal of a desired amplitude, frequency, and phase. For example, the I signal can be used to represent an in-phase component of the sinusoidal wave and the Q signal can be used to represent a quadrature component of the sinusoidal wave, which can be an equivalent representation of the sinusoidal wave. In certain implementations, the I and Q signals can be provided to the I/Q modulator 37 in a digital format. The baseband processor 34 can be any suitable processor configured to process a baseband signal. For instance, the baseband processor 34 can include a digital signal processor, a microprocessor, a programmable core, or any combination thereof. Moreover, in some implementations, two or more baseband processors 34 can be included in the power amplifier system 26.

The I/Q modulator 37 can be configured to receive the I and signals from the baseband processor 34 and to process the I and Q signals to generate an RF signal. For example, the I/Q modulator 37 can include DACs configured to convert the I and Q signals into an analog format, mixers for upconverting the I and Q signals to radio frequency, and a signal combiner for combining the upconverted I and Q signals into an RF signal suitable for amplification by the power amplifier 32. In certain implementations, the I/Q modulator 37 can include one or more filters configured to filter frequency content of signals processed therein.

The power amplifier bias circuit 30 can receive an enable signal ENABLE from the baseband processor 34 and a battery or power high voltage $V_{CC}$ from the battery 21, and can use the enable signal ENABLE to generate a bias voltage $V_{BIAS}$ for the power amplifier 32.

Although FIG. 3 illustrates the battery 21 directly generating the power high voltage $V_{CC}$, in certain implementations the power high voltage $V_{CC}$ can be a regulated voltage generated by a regulator that is powered using the battery 21. In one example, a switching regulator, such as a buck and/or boost converter, can be used to generate the power high voltage $V_{CC}$.

The power amplifier 32 can receive the RF signal from the I/Q modulator 37 of the transceiver 33, and can provide an amplified RF signal to the antenna 14 through the switches 12.

The directional coupler 24 can be positioned between the output of the power amplifier 32 and the input of the switches 12, thereby allowing an output power measurement of the power amplifier 32 that does not include insertion loss of the switches 12. The sensed output signal from the directional coupler 24 can be provided to the mixer 38, which can multiply the sensed output signal by a reference signal of a controlled frequency so as to downshift the frequency content of the sensed output signal to generate a downshifted signal. The downshifted signal can be provided to the ADC 39, which can convert the downshifted signal to a digital format suitable for processing by the baseband processor 34.

By including a feedback path between the output of the power amplifier 32 and the baseband processor 34, the baseband processor 34 can be configured to dynamically adjust the I and Q signals to optimize the operation of the power amplifier system 26. For example, configuring the power amplifier system 26 in this manner can aid in controlling the power added efficiency (PAE) and/or linearity of the power amplifier 32.

Power Amplifier Bias

A theoretically ideal power amplifier has linear gain and phase characteristics regardless of the input or output power of the power amplifier. The gain characteristics of a power amplifier may be plotted on an AM/AM graph which illustrates the change in output amplitude vs. the change in input amplitude. As used herein, AM may refer to amplitude variation. The theoretically ideal power amplifier has a variation in the AM/AM plot of 0 dB/dB. The phase characteristics of a power amplifier may be plotted on an AM/PM graph which illustrates the change in output phase vs. the change in input amplitude. As used herein, PM may refer to phase variations. Similar to the ideal AM/AM characteristics, the theoretically ideal power amplifier has a variation in the AM/PM plot of 0 dB/dB.

Since real-world power amplifiers cannot achieve the flat gain and phase characteristics of the theoretical ideal power amplifier, one important aspect of power amplifier design is improving the linearity of the gain and phase characteristics of the power amplifier. In certain implementations, there may be trade-offs in terms of the achievable linearity of the gain and phase characteristics of a power amplifier without negatively affecting the output power and efficiency of the power amplifier. In a multi-stage power amplifier system, the gain and phase characteristics of the power amplifiers at each stage in the system may be selected such that the overall gain and phase characteristics are substantially liner.

Figure 4:
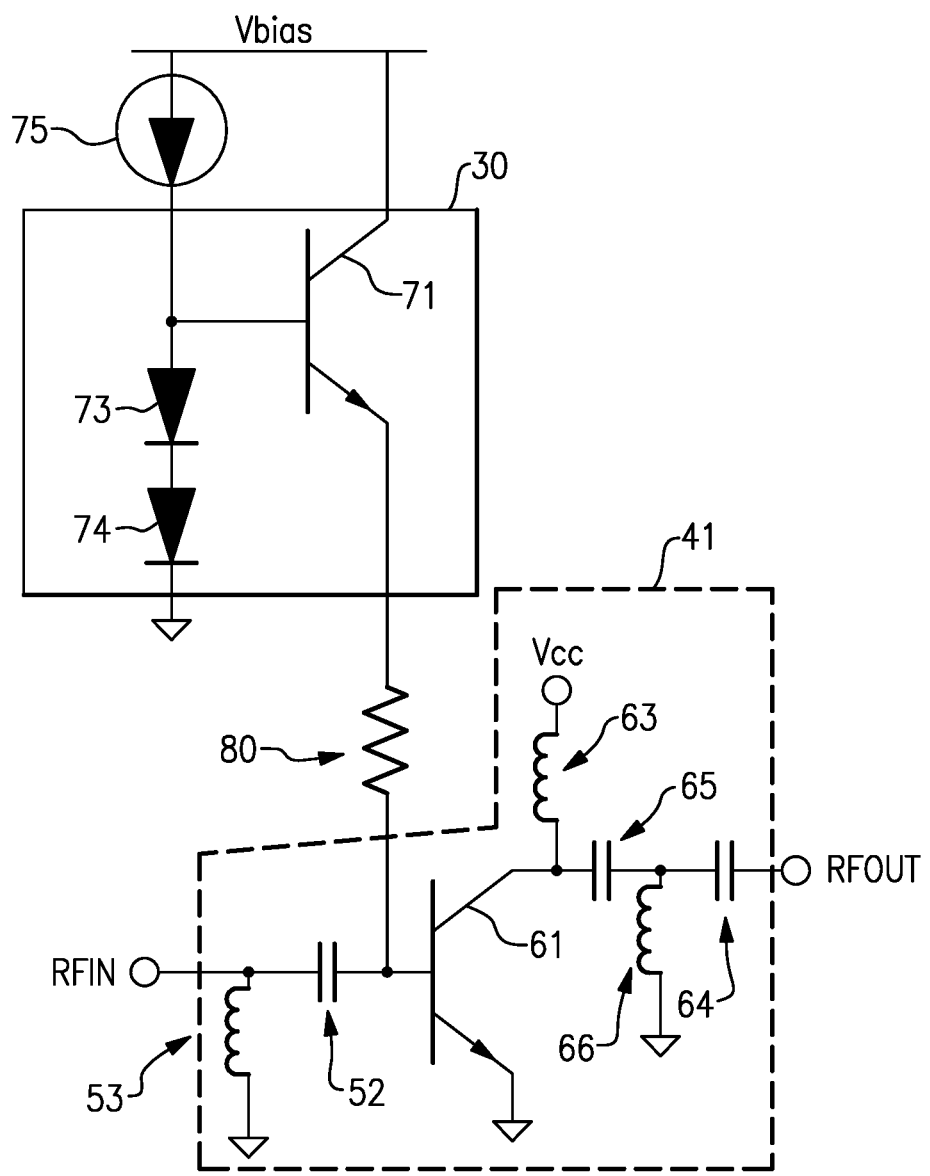
FIG. 4 is a schematic block diagram of another example of a power amplifier system in accordance with aspects of this disclosure.

FIG. 4 is a schematic block diagram of another example of a power amplifier system in accordance with aspects of this disclosure. In particular, the illustrated power amplifier system 27 includes a power amplifier bias circuit 30, a power amplifier stage 41, a current source 75, and a bias impedance component 80. The power amplifier bias circuit 30 may include a transistor 71 and two diodes 73 and 74. The components of the power amplifier bias circuit 30, together with the current source 75, may be arranged so as to generate a current mirror which mirrors the current generated by the power amplifier stage 41. The output of the power amplifier bias circuit 30 is supplied to the bias impedance component 80, which is turn coupled to the power amplifier stage 41 to provide a bias signal thereto.

The power amplifier stage 41 is configured to receive both an input RF signal RFIN and the bias signal from the bias impedance component 80. Based on the received signals, the power amplifier stage 41 is configured to generate an output RF signal RFOUT. The power amplifier stage 41 is configured to generate the output RF signal RFOUT as an amplified version of the input RF signal RFIN having gain and phase characteristics which approach that of the theoretical ideal power amplifier (e.g., the gain and phase characteristics are designed to be within a threshold range of 0 dB/dB). The power amplifier stage 41 includes a transistor 61, a plurality of capacitors 52, 65, and 64, and a plurality of inductors 53, 63, and 66. The capacitors 52, 65, and 64 and inductors 53, 63, and 66 couple the transistor 61 to receive the input RF signal RFIN, and a power supply voltage Vcc and to generate the output RF signal RFOUT.

The base of the transistor 61 receives the bias signal generated by the power amplifier bias circuit 30 via the bias impedance component 80. In certain implementations, the impedance value of the bias impedance component 80 may be selected to dominate the overall bias impedance applied to the base of the transistor 61. In certain implementations the bias impedance applied to the base of the transistor 61 may be equal to the sum of the output impedance of the transistor 71 and the impedance value of the bias impedance component 80. Thus, the impedance value of the bias impedance component 80 may be selected to dominate the impedance value of the transistor 71 (e.g., the impedance value of the bias impedance component 80 may be one or more orders of magnitude larger than the impedance value of the transistor 71). In exemplary embodiments, the output impedance of the transistor 71 is inversely related to the trans conductance of the transistor 71, which may result in an output impedance for the transistor 71 on the order of 10Ω.

In certain embodiments, the transistor 61 may comprise a heterojunction bipolar transistor (HBT), which may adapted for the high frequency signals the power amplifier system 27 is designed to receive and amplify. In particular, HBTs may have high performance and efficiency for RF power amplification as used in the embodiments disclosed herein. In order to properly generate the mirror current in the power amplifier bias circuit, the transistor 71 may also comprise an HBT in certain embodiments.

One technique for adjusting the gain and phase characteristics of a power amplifier may be to select a fixed bias impedance to be applied to the bias signal supplied to the base of the transistor 61. The particular bias impedance may be selected during design and development of the power amplifier stage 41 and implemented by selecting the impedance value of the bias impedance component 80. For example, the impedance value of the bias impedance component 80 may be selected via die variants and/or laser trim-able resistors. However, the impedance value of the bias impedance component 80 may be selected to adjust and/or improve the linearity of the gain and phase characteristics for the power amplifier system 27 for a single power level, modulation, and frequency. Thus, if the power amplifier system 27 is used at a different power level, modulation, and/or frequency from the values used in selecting the value of the bias impedance component 80, the linearity of the gain and/or phase characteristics of the power amplifier system may suffer.

Figure 5A:
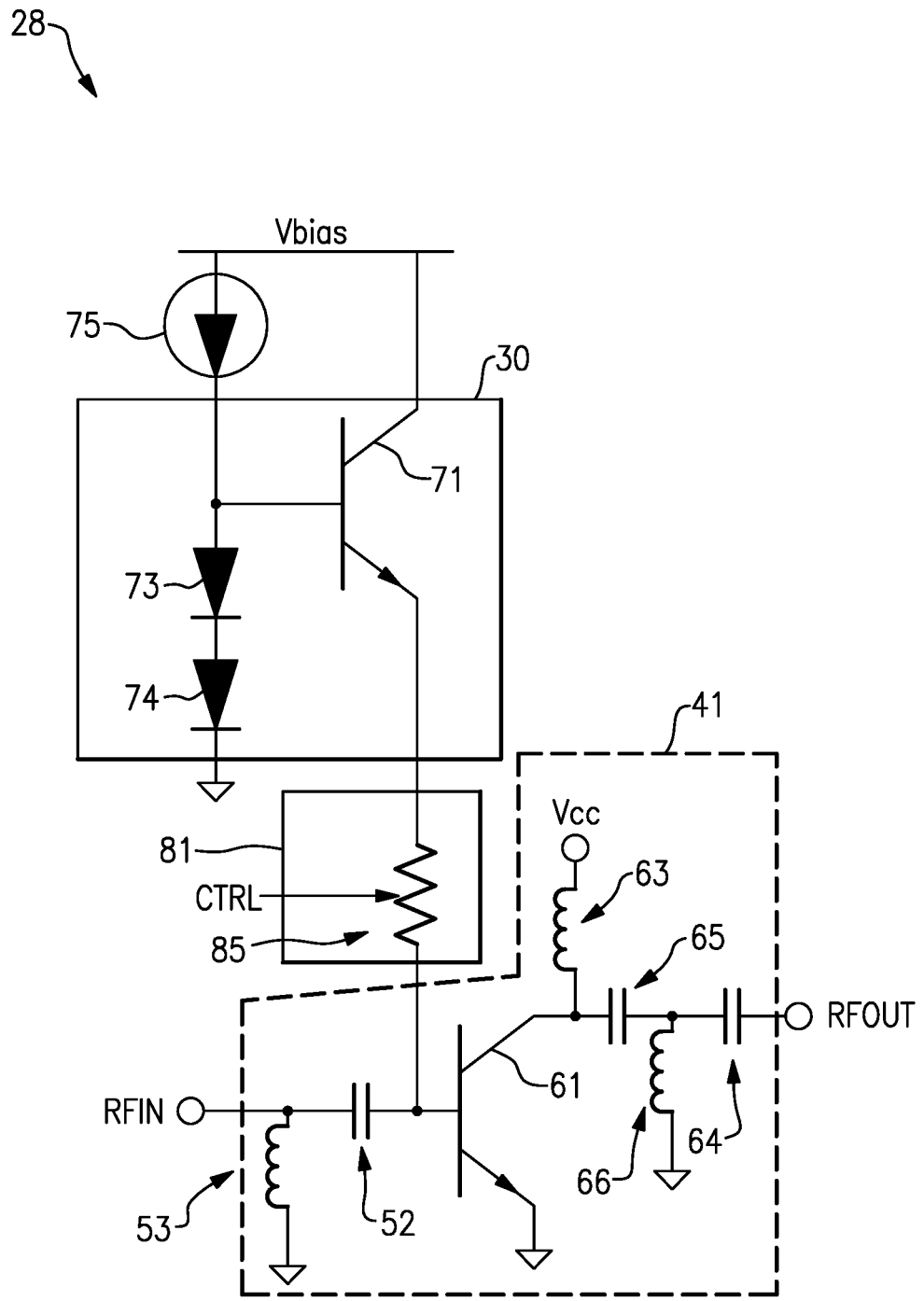
FIG. 5A is a schematic block diagram of yet another example of a power amplifier system in accordance with aspects of this disclosure.

Accordingly, certain aspects of this disclosure relate to the use of a variable bias impedance component which may be applied to bias a power amplifier. FIG. 5A is a schematic block diagram of yet another example of a power amplifier system in accordance with aspects of this disclosure. Components of the power amplifier system 28 illustrated in FIG. 5A which are similar to, or substantially the same as, components in the power amplifier system 27 illustrated in FIG. 4 are represented by the same reference numerals and detailed descriptions thereof may be omitted for the sake of clarity.

As shown in FIG. 5A, the power amplifier system 28 includes a power amplifier bias circuit 30, a power amplifier stage 41, a current source 75, and a bias impedance component 81. In FIG. 5A, the bias impedance component may be implemented as a variable bias impedance component 85. Similar to the power amplifier system 27 of FIG. 4, in the embodiment of FIG. 5A, the output of the power amplifier bias circuit 30 is supplied to the variable bias impedance component 85, which is in turn coupled to the power amplifier stage 41 to provide a bias signal thereto. The variable bias impedance component 85 may be configured to receive a control signal CTRL configured to adjust the impedance value of the variable bias impedance component 85. Accordingly, the impedance value of the variable bias impedance component 85 may be adjusted based on the voltage of the control signal CTRL. In the illustrated example, the variable bias impedance component 85 can be implemented using any variable impedance element (e.g., a variable resistor) controllable by a control signal CTRL.

Certain variable impedance technologies may not be practical for all power amplifier systems 28, and in particular, for power amplifiers which may be implemented in mobile phones to amplify RF signals for transmission. As discussed above, in certain RF power amplifier applications, it is desirable to implement the transistor 61 of the amplifier stage 41 as an HBT transistor since HBTs may have the performance and efficiency characteristics that are desirable for use in an RF power amplifier. In come semiconductor fabrication techniques, it may be difficult to combine different device technologies on a single semiconductor die. For example, the combination of an HBT with a field effect transistor (FET) onto the same semiconductor die may not result in a device having the desired transistor properties. As discussed in U.S. Pat. No. 9,105,488 B2, patented on Aug. 11, 2015, hereby incorporated by reference in its entirety, some attempts to integrate a FET into a GaAs HBT process have resulted only in an n-type FET device. However, recent developments in the fabrication technology as exemplified by U.S. Pat. No. 9,105,488 B2 have enabled the fabrication of HBTs and FETs onto a single semiconductor die.

Figure 5B:
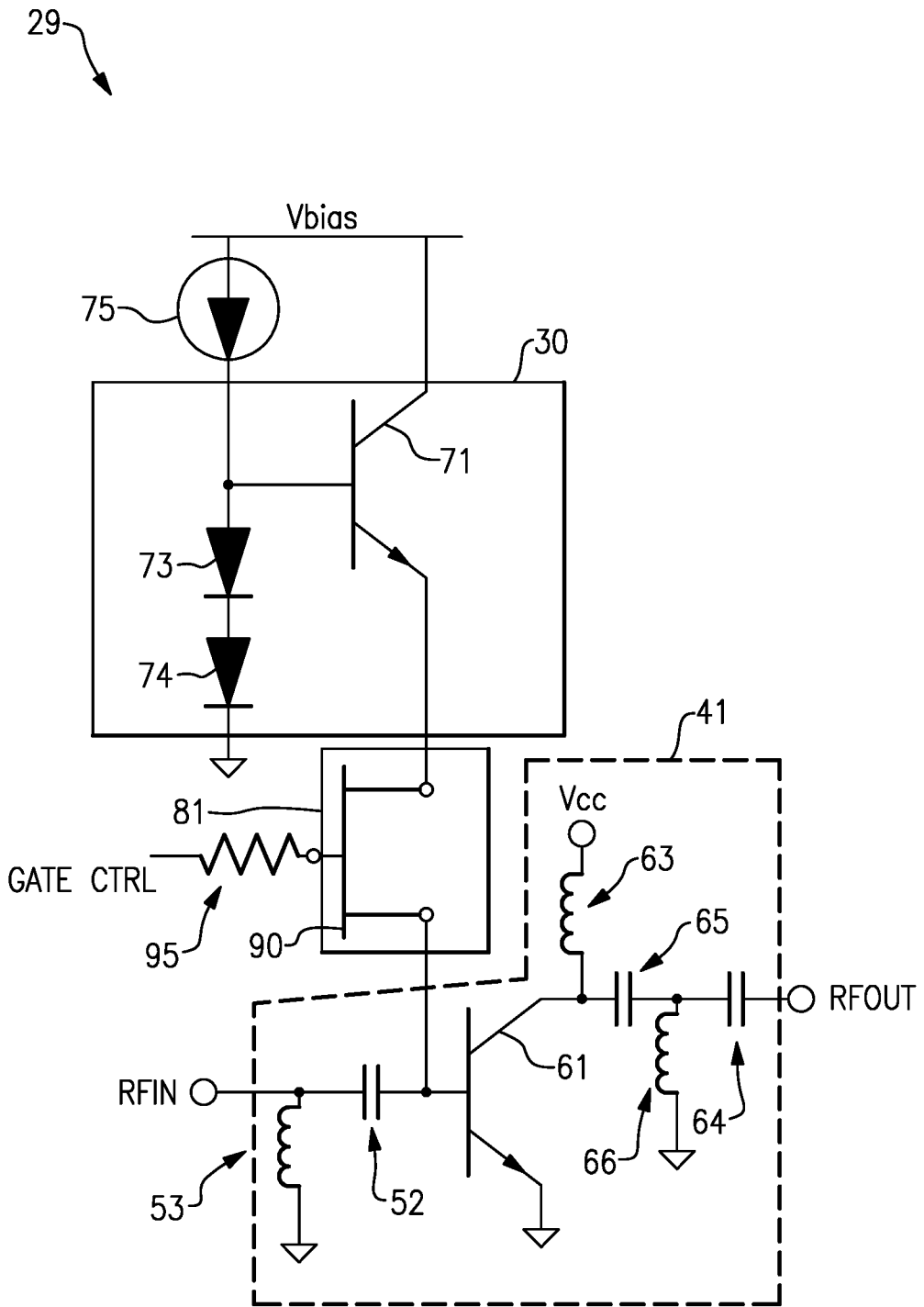
FIG. 5B is a schematic block diagram of still yet another example of a power amplifier system in accordance with aspects of this disclosure.

Using techniques which enable the fabrication of a semiconductor device having both HBT and FET technologies, one embodiment of the power amplifier 28 of FIG. 5A is illustrated in FIG. 5B. FIG. 5B is a schematic block diagram of still yet another example of a power amplifier system in accordance with aspects of this disclosure. The power amplifier 29 illustrated in FIG. 5B includes a power amplifier bias circuit 30, a power amplifier stage 41, and a current source 75, each of which may be the same as or similar to those discussed above in connection with FIG. 5A. The power amplifier 29 further includes bias impedance component 81 which includes an FET 90 in place of the variable bias impedance component 85 of FIG. 5A. The FET 90 may be configured to receive a control signal CTRL at a gate thereof via an optional resistor 95. The control signal is configured to adjust the impedance value of the FET 90. Accordingly, the impedance value of the FET 90 may be adjusted by selecting the voltage of the control signal CTRL. In exemplary embodiments, the FET 90 may be operated in triode via the selection of the voltage of the control signal CTRL. As understood by those skilled in the art, the triode region of the FET 90 may refer to a range of voltages which can be applied to the gate of the FET 90 such that the FET 90 operates in a fashion similar to a resistor (e.g., the FET 90 may have a substantially linear response while operated in triode). Thus, the impedance of the FET 90 may be controlled by the control signal CTRL when the FET 90 is operated within the triode region.

Figure 6A:
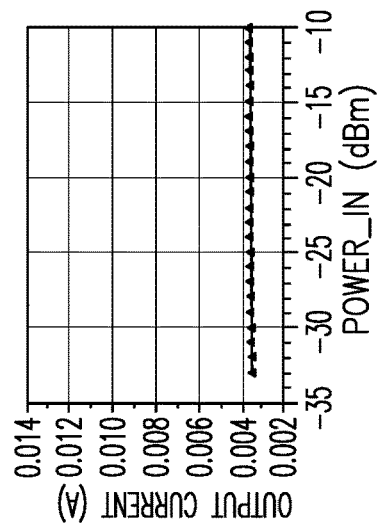
FIGS. 6A-6F are graphs illustrating the effect of changes in the bias impedance on power amplifier characteristics in accordance with aspects of this disclosure.

The value of the bias impedance supplied to the base of the transistor 61 of the amplifier stage 41 may affect the gain and phase characteristics of the power amplifier 28 or 29. In particular, FIGS. 6A-6F are graphs illustrating the effect of changes in the bias impedance on power amplifier characteristics in accordance with aspects of this disclosure. FIGS. 6A-6O illustrate power amplifier characteristics when a relatively high impedance is applied to the base of the transistor of a power amplifier while FIGS. 6D-6F illustrate power amplifier characteristics when a relatively low impedance is applied to the base of the transistor of a power amplifier. FIGS. 6A-6F are meant only to illustrate how increasing or decreasing the bias impedance value affects the power amplifier characteristics, and thus, the specific values of the bias impedance value which result in the illustrated graphs are not limiting. In certain embodiments, a "low"

impedance value may be substantially zero impedance while a "high" impedance value may be an infinite impedance value.

FIGS. 6A and 6D are graphs which show the base-collector voltage (V) and base current (A) of a transistor (such as transistor 61 of FIG. 5A or 5B) in a power amplifier as a function of the input power (dBm) to the transistor under "high" and "low" bias impedance. Of note in the high bias impedance of FIG. 6A, the base-collector voltage (V) decreases with increasing input power while in the low bias impedance of FIG. 6D, the base-collector voltage (V) is substantially fixed with increasing input power.

Figure 6B:
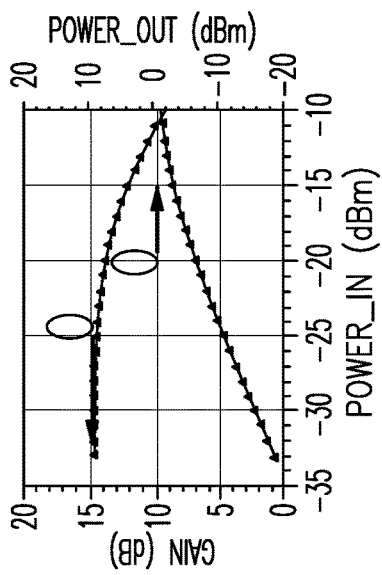
Figure 6C:
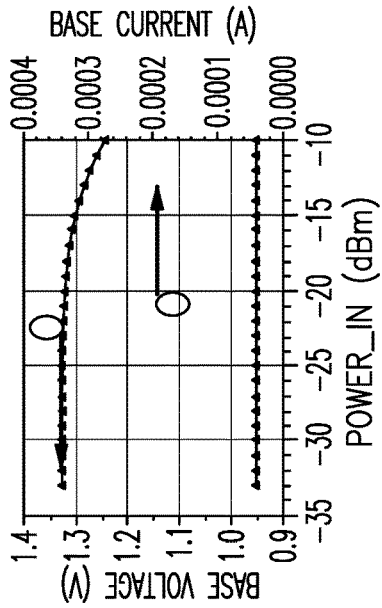
Figure 6D:
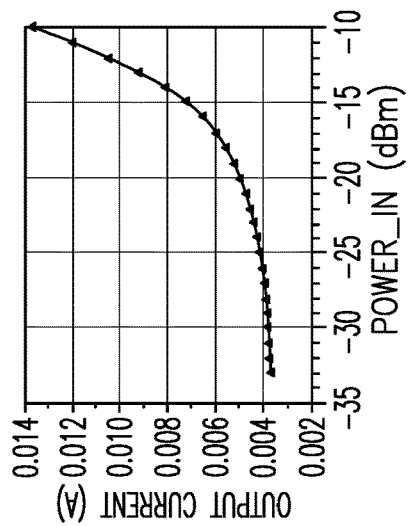
Figure 6E:
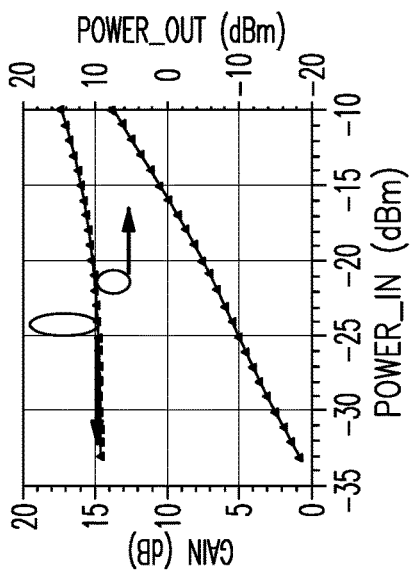
Figure 6F:
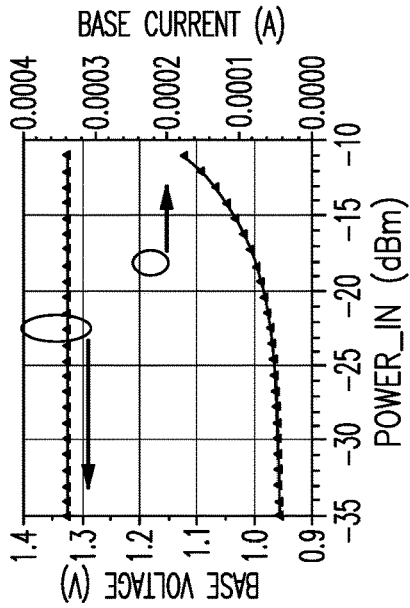

FIGS. 6B and 6E are graphs which show the gain (dB) and output power (dBm) of the transistor in a power amplifier as a function of the input power (dBm) to the transistor under "high" and "low" bias impedance. Here, in the high bias impedance of FIG. 6B, the gain "compresses" or decreases with increasing input power while in the low bias impedance of FIG. 6E, the gain increases with increasing input power. Thus, by selecting the bias impedance with a value between the illustrated "high" and "low" values, the gain characteristics of the power amplifier can be improved by flattening the gain out, thereby improving gain linearity.

FIGS. 6C and 6F are graphs which show the output current (A) of the transistor in a power amplifier as a function of the input power (dBm) to the transistor under "high" and "low" bias impedance. Here, in the high bias impedance of FIG. 6C, the DC output current is substantially fixed with respect to input power while in the low bias impedance of FIG. 6F, the DC output current increases with increasing input power.

Figure 7:
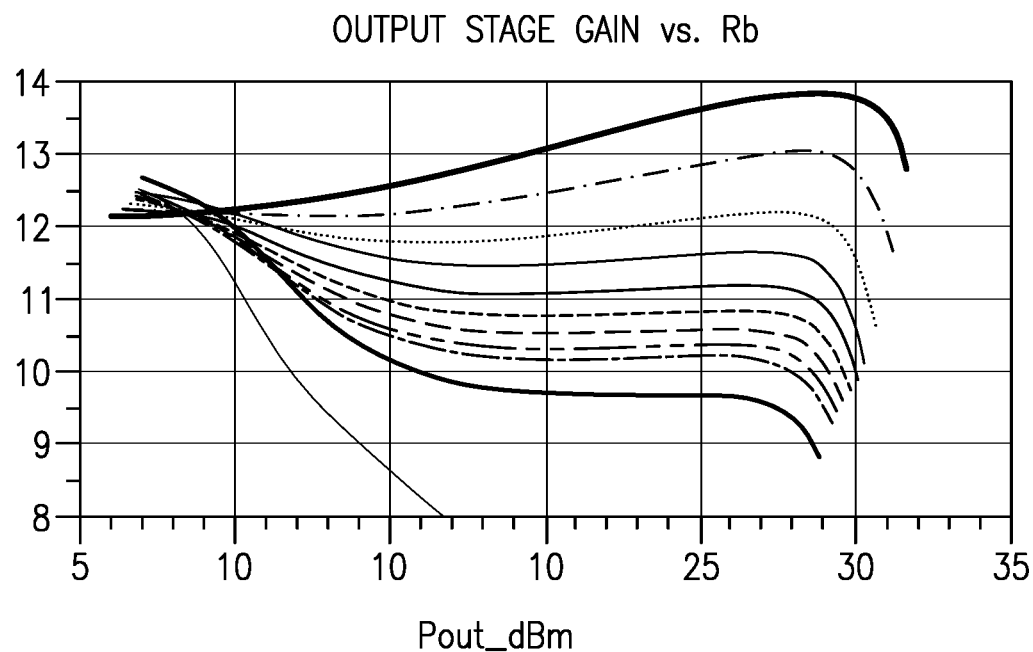
FIG. 7 is a graph illustrating the gain at the output stage of a power amplifier as a function of the output power in accordance with aspects of this disclosure.

FIG. 7 is a graph illustrating the gain at the output stage of a power amplifier as a function of the output power in accordance with aspects of this disclosure. Various gain curves are illustrated in FIG. 7 at different impedance bias levels which range from an impedance of 5Ω to an impedance of 1000Ω as shown in the legend. As the bias impedance is increased the gain drops with increasing output power. In the illustrated embodiment, an impedance bias of 50Ω may be selected to provide a substantially flat gain. However, other power amplifier topologies may result in different output stage gain plots, and thus, the specific impedance bias which results in a substantially flat gain may depend on the particular implementation of the power amplifier.

Figure 8A:
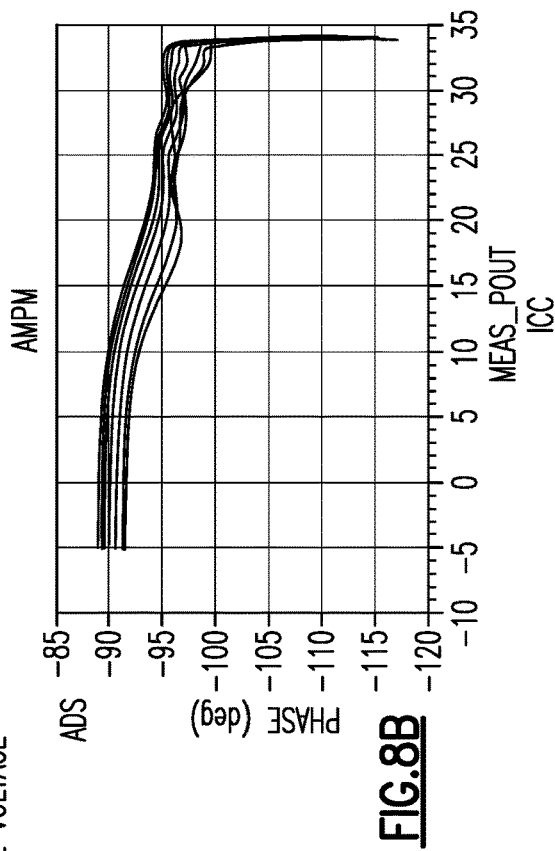
FIGS. 8A-8D illustrate a number of power amplifier characteristics in accordance with aspects of this disclosure.
Figure 8B:
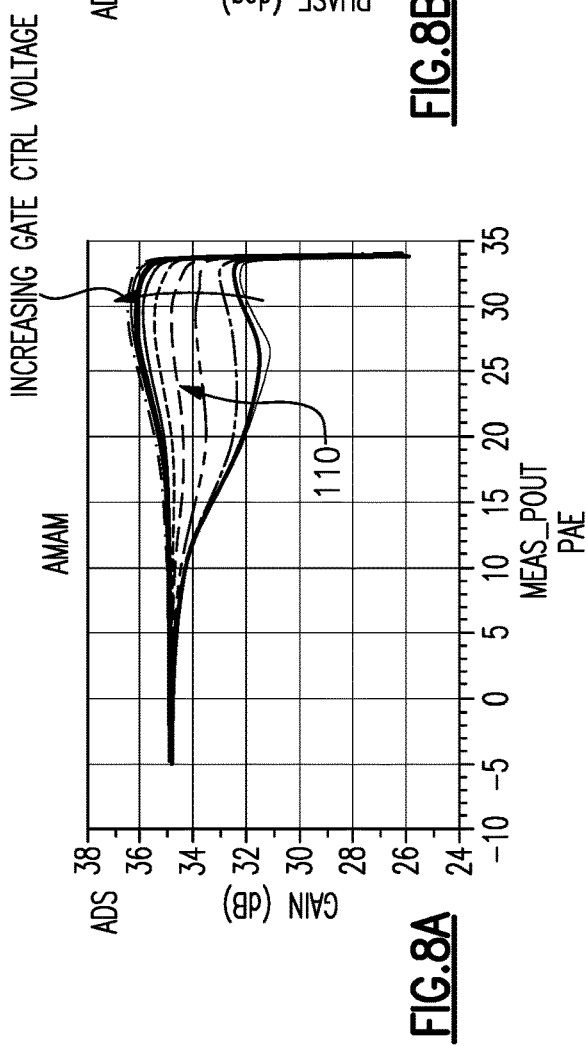
Figure 8C:
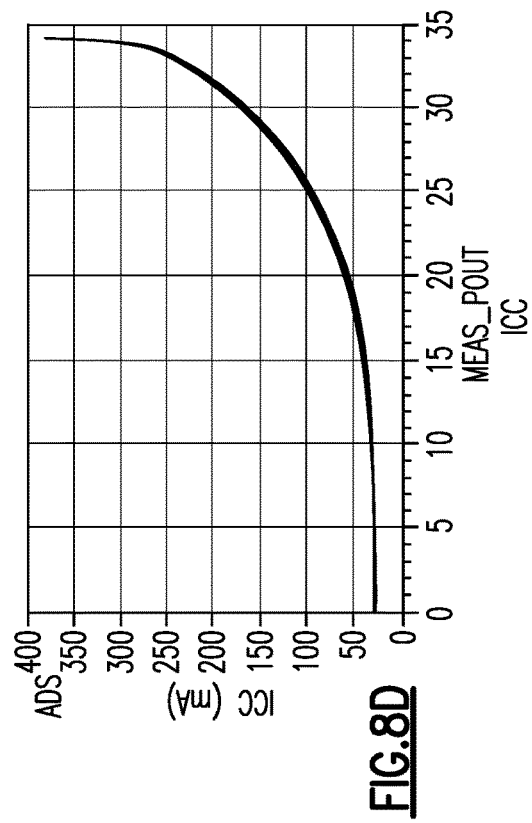
Figure 8D:
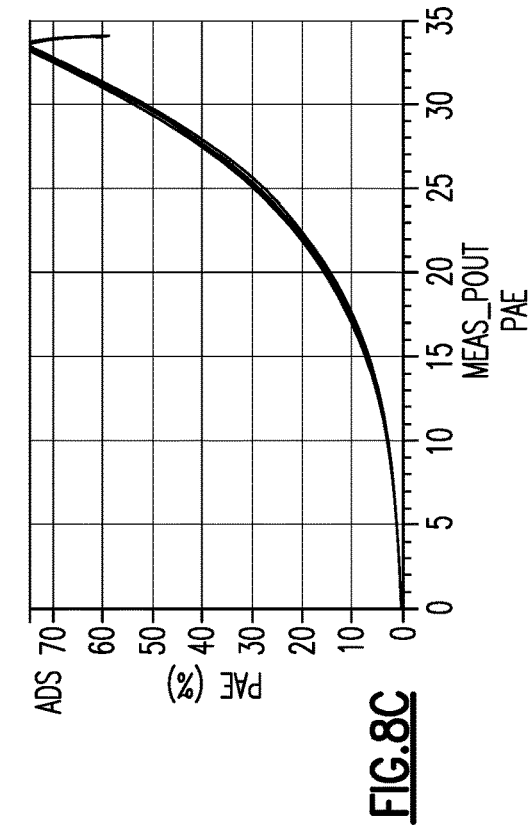

FIGS. 8A-8D illustrate a number of power amplifier characteristics in accordance with aspects of this disclosure. In particular, FIG. 8A illustrates the gain (dB) as a function of output power for a power amplifier at a number of different bias impedance values; FIG. 8B illustrates the phase (deg) as a function of output power for a power amplifier at the different bias impedance values; FIG. 8C illustrates the power amplifier efficiency (%) as a function of output power for a power amplifier at the different bias impedance values; and FIG. 8D illustrates the transistor collector current (mA) as a function of output power for a power amplifier at the different bias impedance values.

As shown in FIGS. 8B-8C, the bias impedance value does not have a significant effect on the phase, power amplifier efficiency, or transistor collector current characteristics of the power amplifier. However, as shown in FIG. 8A, the bias impedance value affects the gain characteristics of the power amplifier, with increasing gate control voltage (e.g., increasing bias impedance) resulting in an increase in gain as a function of output power. Thus, the adjustment of the bias impedance may be an effective tool for adjusting the gain characteristics of the power amplifier without significantly affecting the phase, power amplifier efficiency, and transistor collector current characteristics of the power amplifier.

FIG. 9 illustrates an embodiment of a multi-stage power amplifier system in accordance with aspects of this disclosure. In particular, the power amplifier system 121 of FIG. 9A includes a first power amplifier 120 and a second power amplifier 125 connected in series between an RF input port RFIN and an RF output port RFOUT. Each of the first and second power amplifiers 120 and 125 may be the same as or similar to the power amplifier 29 illustrated in FIG. 5B. Thus, a detailed described of each of the constituent components will not be provided. In the embodiment of FIG. 9, the bias impedance value supplied to the base of the transistors 61 of each of the power amplifiers 120 and 125 may be individually selected in accordance with the particular implementations of the amplifier stages 41 and the power amplifier bias circuits 30 in each of the first and second power amplifiers 120 and 125. Further, the bias impedances selected by the gate control voltages Gate CTRL applied to the respective amplifier stages 41 may be selected such that the overall gain of the power amplifier system 121 (e.g., the gain at the output port RFOUT for a signal applied to the input port RFIN) is sufficiently flat. Thus, in certain implementations, the gains of each of the first and second power amplifiers 120 and 125 may not be substantially flat so long as the overall gain of the power amplifier system 121 has a variation that is less than a threshold value from the ideal variation of 0 dB/dB.

Figure 10:
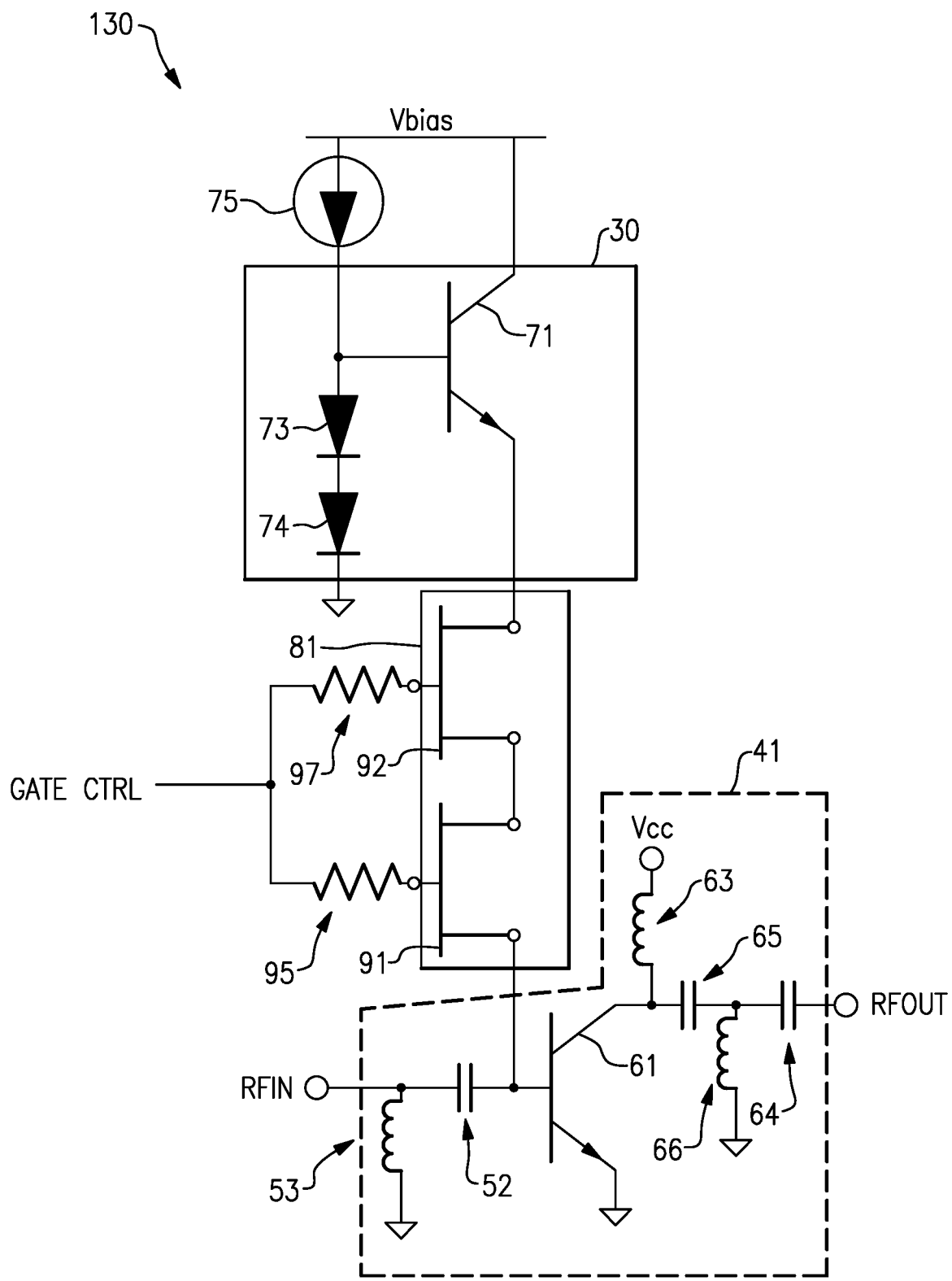
FIG. 10 is a schematic block diagram of another example of a power amplifier system in accordance with aspects of this disclosure.

FIG. 10 is a schematic block diagram of another example of a power amplifier system in accordance with aspects of this disclosure. The power amplifier 130 illustrated in FIG. 10 includes a power amplifier bias circuit 30, a power amplifier stage 41, and a current source 75, each of which may be the same as or similar to those discussed above in connection with FIG. 5A or FIG. 5B. The power amplifier 130 further includes a bias impedance component 81 which includes a pair of FETs 91 and 92 in place of the single FET 90 of FIG. 5B. The control signal CTRL may be applied to the gate of each of the FETs 91 and 92 via respective resistors 95 and 97. Depending on the implementation, the use of two FETs 91 and 92 may increase the range of values for the impedance bias provided by the combination of the FETs 91 and 92 while maintaining the FETs 91 and 92 in triode. Although not illustrated in FIG. 10, a similarly structured circuit (including two FETs and input resistors) may be included in the power amplifier bias circuit to preserve the correct current mirror ratio.

Figure 11:
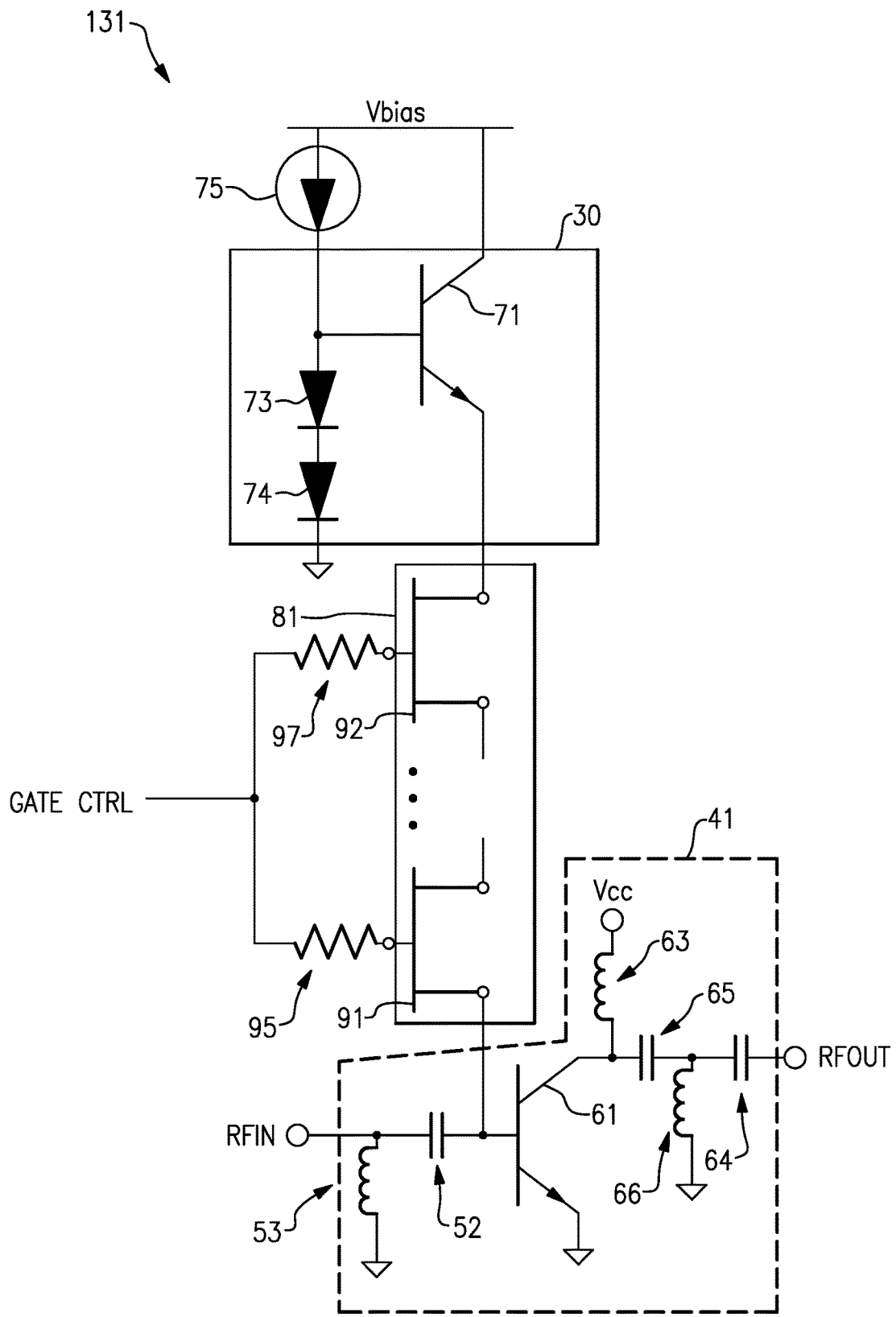
FIG. 11 is a schematic block diagram of yet another example of a power amplifier system in accordance with aspects of this disclosure.

FIG. 11 is a schematic block diagram of yet another example of a power amplifier system in accordance with aspects of this disclosure. The power amplifier 131 illustrated in FIG. 11 is similar to the power amplifier 130 illustrated in FIG. 10, except for the inclusion of three or more FETs 91 to 92 in the bias impedance component 81, where the inclusion of additional FETs is illustrated by the ellipses, By including three or more FETs 91 to 92 in the bias impedance component 81, the range of bias impedance values that can be generated while maintaining the FETs 91 and 92 in triode increases. As described above in connection with FIG. 10, the same structure (including the same number of FETs and resistors) can be included in the power amplifier bias circuit to preserve the current mirror ratio.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:
a bias circuit configured to receive a bias voltage and generate a bias signal;
at least one power amplifier stage configured to receive an input radio frequency signal and generate an output radio frequency signal; and
at least first and second bias impedance components operatively coupled between at least one bias circuit and at least one power amplifier stage, the first and second bias impedance components configured to bias the at least one power amplifier stage with a variable impedance based on a control signal that is received separately from the bias circuit, each of the at least first and second bias impedance components configured to receive the same control signal.

2. The power amplifier system of claim 1 wherein first and second bias impedance components include at least first and second transistors and the control signal has a voltage configured to operate the first and second transistors in a triode region.

3. The power amplifier system of claim 2 wherein the first and second transistors include first and second field effect transistors and the at least one power amplifier stage includes at least a heterojunction bipolar transistor configured to amplify the input radio frequency signal.

4. The power amplifier system of claim 3 wherein the first and second field effect transistors and the heterojunction bipolar transistor are fabricated on a single semiconductor die.

5. The power amplifier system of claim 1 wherein an impedance value of the first and second bias impedance components is selected such that variation in a gain of the at least one power amplifier stage is less than a threshold value from 0 dB/dm.

6. The power amplifier system of claim 1 wherein the first and second bias impedance components are connected in serial.

7. The power amplifier system of claim 1 further comprising three or more bias impedance components.

8. The power amplifier system of claim 1 wherein the first bias impedance component is connected between a first bias circuit and a first power amplifier stage and the second bias impedance component is connected between a second bias circuit and a second power amplifier stage.

9. A method of adjusting a gain of a power amplifier stage, comprising:
generating with at least one bias circuit, at least one bias signal;
receiving, via at least first and second bias impedance components, the bias signal and a control signal, the control signal being received separately from the bias circuit, each of the at least first and second bias impedance components receiving the same control signal;
adjusting a variable impedance of the first and second bias impedance components based on the control signal; and
biasing at least one power amplifier stage with the variable impedance to vary the generation of an output radio frequency signal.

10. The method of claim 9 wherein the first and second bias impedance components include first and second transistors, and the control signal operates the first and second transistors in a triode region.

11. The method of claim 10 wherein the first and second transistors include field effect transistors and the at least one power amplifier stage includes a heterojunction bipolar transistor, the method further comprising amplifying, at the heterojunction bipolar transistor, the output radio frequency signal.

12. The method of claim 11 wherein the field effect transistors and the heterojunction bipolar transistor are fabricated on a single semiconductor die.

13. The method of claim 9 further comprising selecting a voltage of the control signal to produce the impedance value of the first and second impedance components such that variation in a gain of the at least one power amplifier stage is less than a threshold value from 0 dB/dm.

14. The method of claim 9 further comprising connecting the first and second bias impedance components in serial.

15. The method of claim 9 further comprising connecting three or more bias impedance components together.

16. The method of claim 9 further comprising connecting the first bias impedance component between a first bias circuit and a first power amplifier stage and connecting the second bias impedance component between a second bias circuit and a second power amplifier stage.

17. A mobile device comprising:
a bias circuit configured to receive a bias voltage and generate a bias signal;
at least one power amplifier stage configured to receive an input radio frequency signal and generate an output radio frequency signal;
at least first and second bias impedance components operatively coupled between at least one bias circuit and at least one power amplifier stage, the first and second bias impedance components configured to bias the at least one power amplifier stage with a variable impedance based on a control signal that is received separately from the bias circuit, each of the at least first and second bias impedance components configured to receive the same control signal; and
a modulator configured to generate a radio frequency transmit signal based on the output radio frequency signal.

18. The mobile device of claim 17 wherein the first and second bias impedance components are connected in serial.

19. The mobile device of claim 17 further comprising three or more bias impedance components.

20. The mobile device of claim 17 wherein the first bias impedance component is connected between a first bias circuit and a first power amplifier stage and the second bias impedance component is connected between a second bias circuit and a second power amplifier stage.

\* \* \* \* \*